(12) United States Patent
Gibson

(10) Patent No.: US 8,030,843 B2
(45) Date of Patent: Oct. 4, 2011

(54) QUANTUM DOT PHOSPHORS FOR SOLID-STATE LIGHTING DEVICES

(75) Inventor: Charles Phillip Gibson, Oshkosh, WI (US)

(73) Assignee: Wisys Technology Foundation, Madison, WI (US)

( * ) Notice: Subject to any disclaimer, the term of this patent is extended or adjusted under 35 U.S.C. 154(b) by 210 days.

(21) Appl. No.: 12/502,560

(22) Filed: Jul. 14, 2009

(65) Prior Publication Data

US 2010/0006775 A1    Jan. 14, 2010

Related U.S. Application Data

(60) Provisional application No. 61/080,445, filed on Jul. 14, 2008.

(51) Int. Cl.
*H05B 33/00*    (2006.01)
*H01J 1/62*    (2006.01)

(52) U.S. Cl. ................................... 313/506; 313/501
(58) Field of Classification Search .......... 313/498–512; 257/14
See application file for complete search history.

(56) References Cited

U.S. PATENT DOCUMENTS

| | | | |
|---|---|---|---|
| 2006/0221021 A1* | 10/2006 | Hajjar et al. | 345/84 |
| 2007/0103068 A1 | 5/2007 | Bawendi et al. | |
| 2007/0170418 A1 | 7/2007 | Bowers et al. | |

* cited by examiner

*Primary Examiner* — Joseph L Williams
(74) *Attorney, Agent, or Firm* — Boyle Fredrickson, S.C.

(57) ABSTRACT

A phosphor for use, for example, with an ultraviolet LED to provide a broad-spectrum white light approximating diffuse sunlight, that includes quantum dots spaced from an activator material by a capping layer surrounding the quantum dots. This approach of spacing an activator material from the quantum dots provides improved spectral output for quantum dots of materials such as zinc sulfide.

21 Claims, 3 Drawing Sheets

QUANTUM DOT PHOSPHORS FOR SOLID-STATE LIGHTING DEVICES

CROSS-REFERENCE TO RELATED APPLICATIONS

This application claims the benefit of U.S. provisional application 61/080,445 filed Jul. 14, 2008 and hereby incorporated by reference.

BACKGROUND OF THE INVENTION

The present invention relates generally to solid-state devices for area illumination and, in particular, to an improved light emitting diode lamp employing quantum dot phosphors.

There is considerable interest in developing improved solid-state lamps for area illumination in order to reduce electrical power usage and, ultimately, the production of atmospheric carbon.

Current incandescent lamps, which generally provide black body radiation from a heated filament at approximately 3000° K., produce a continuous spectrum analogous to that of sunlight (white light) with an efficiency of approximately 5%. Sunlight, in contrast, approximates a black body radiator at 5700° K.

Improved efficiencies over incandescent lamps may be obtained by fluorescent lamps which employ a gas discharge to generate ultraviolet light which in turn excites a phosphor coated on the inside of the lamp tube. Such fluorescent lamps reach an efficiency of approximately 20% but provide a spectrum that deviates substantially from the desirable continuous spectrum provided by incandescent bulbs. The spectrum of a fluorescent lamp typically exhibits several distinct spectral peaks associated with each different phosphor used for the coating. A combination of phosphors can produce a spectrum that nevertheless approximates the color perception provided by sunlight.

Light emitting diodes are a promising source for area illumination and currently provide efficiencies ranging from 15 to 30%. The spectral output of an LED is also relatively narrow, defined by the energy released when electrons cross a band gap in the semiconductor materials. Accordingly, broad-spectrum white light requires multiple LEDs (red and green and blue) or, more conventionally, a blue LED illuminating a phosphor similar to the type used in fluorescent lamps. Commonly, a single "yellow" phosphor is used which captures some of the blue light from the LED to down-convert that blue light to yellow. The combined blue and yellow emissions appear to the eye to be approximately white. The resulting light, however, does not match the continuous spectrum normally associate with white light, being particularly deficient in green. For this reason, current white light LEDs can create unnatural color perception that may limit their popularity.

Ideally a "phosphor" could be developed for LEDs that would more closely approximate the continuous spectrum provided by natural sunlight, in particular the blue-green region of the spectrum from 475 to 525 nm, while providing improved efficiencies. Recently some work has suggested that improved efficiencies and light characteristics may be obtained by forming phosphors into quantum dots. In some cases, these phosphors employ quantum dots using relatively expensive or highly toxic materials.

SUMMARY OF THE INVENTION

The present invention provides an improved white light phosphor for LEDs formed by using a nanoparticle-sized phosphor (quantum dot) spaced from an activator by a capping layer. This configuration allows materials such as nanoparticulate zinc sulfide to form white light closely approximating that of diffuse sunlight.

Specifically then, the present invention provides a solid-state lamp including a light emitting diode providing an ultraviolet light output and a quantum dot phosphor receiving the ultraviolet light to emit a white light. In particular, the quantum dot phosphor is made up of a quantum dot, a capping layer surrounding the quantum dot, and an activator material attached to the capping layer to be spaced from the quantum dot by the capping layer so as to promote phosphorescence with the quantum dot.

It is thus a feature of at least one embodiment of the invention to provide for quantum dot phosphors whose phosphorescence is controlled by a spaced activator.

In one embodiment, the quantum dot is a zinc compound and, in particular, zinc sulfide.

It is thus a feature of at least one embodiment of the invention to provide for a quantum dot phosphor using inexpensive and low toxicity materials.

In one embodiment, the activator may include zinc.

It is thus a feature of at least one embodiment of the invention to provide for a low cost and low toxicity activator that provides a phosphorescence closely approximating diffuse sunlight.

These particular objects and advantages may apply to only some embodiments falling within the claims and thus do not define the scope of the invention.

DETAILED DESCRIPTION OF THE INVENTION

Overview

Figure 1:
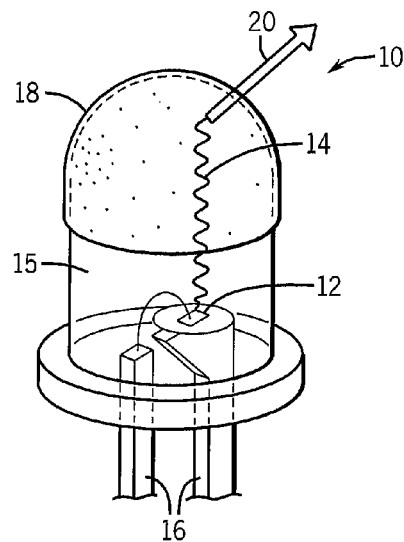
FIG. 1 is a perspective view of one embodiment of a lamp formed with the phosphor material of the present invention.
Figure 2:
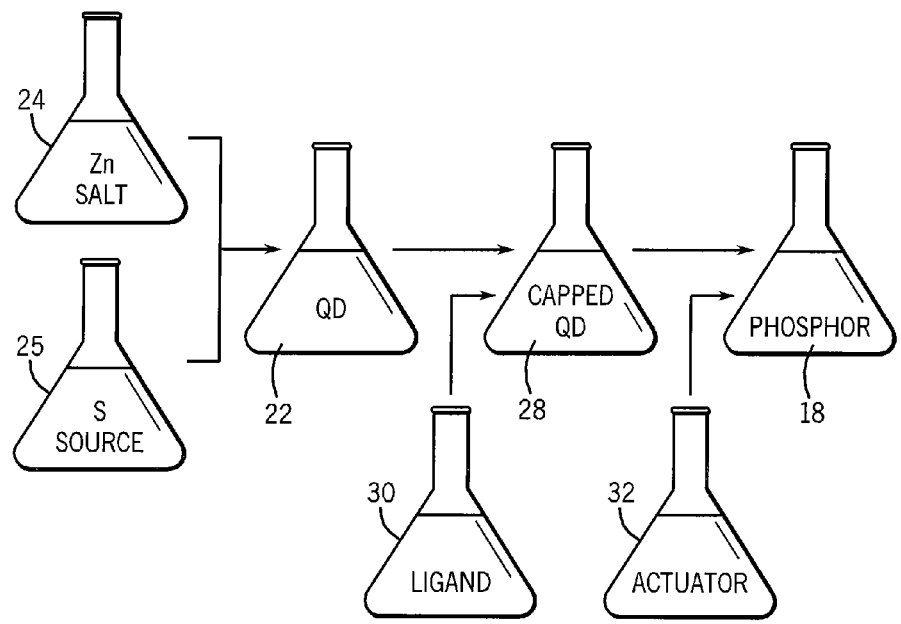
FIG. 2 is a schematic view of the method of producing the phosphor material of the present invention utilized in the lamp of FIG. 1.
Figure 3A:
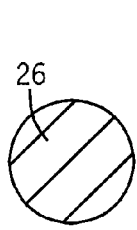
FIGS. 3A-3C are schematic views of the intermediate structures of the phosphor material at each step in the method of FIG. 2.
Figure 3B:
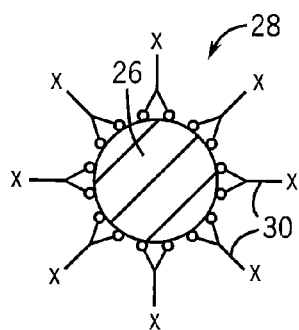
Figure 3C:
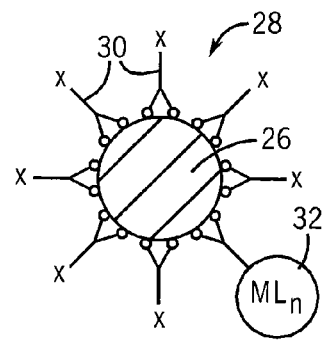

Referring now to FIG. 1, a lamp 10 constructed using the materials of the present invention may provide for a light emitting diode die 12 fabricated by conventional means to produce ultraviolet light emission 14 when electrically biased through leads 16. The die 12 may have a light emission with a wavelength between approximately 365 and 400 nm.

A phosphor material 18 of the present invention may be positioned in the path of the ultraviolet light emission 14, for example coated on a lens material 15 encapsulating the die 12, to receive the ultraviolet light and to re-radiate broad-spectrum light 20 having improved spectral characteristics. In an alternative embodiment, the phosphor material 18 may be incorporated into the die 12 or embedded in the lens material 15. In one embodiment, the broad-spectrum light 20 is "white" light perceptively approximating that provided by natural diffuse sunlight.

Referring now to FIGS. 2 and 3a-3c, the phosphor material 18 may be produced by a series of steps executed in series as shown or in combination, that prepare a precursor quantum dot material, cap the quantum dot with a spacing layer, and attach a phosphor activator to the capping material.

The first step creates a "precursor" nano particulate material 22, for example, through a combination of two materials 24 and 25 promoting an arrested precipitation process, as will be described in more detail below. The precursor nano particulate material 22 provides particles 26 (shown in FIG. 3a) on the order of a few nanometers (e.g. 3 to 8 nm) operating as quantum dots. Materials 24 and 25, in one example, are a zinc salt and a sulfur source and produce nano particulate zinc sulfide particles.

In the second step (shown in FIG. 3b), the particles 26 are "capped" to produce capped quantum dots 28. This capping can be performed, for example, through the introduction of a capping material 30, such as a carboxyl or thiolate group, serving as a ligand. The capping material 30 provides a spacing layer about the particles 26, as will be discussed below, encapsulating the quantum dot 28 and providing a coordinating group on an outwardly extending end of the capping material 30 for the attachment of an activator.

In the third step (shown in FIG. 3c), after capping of the quantum dots, an activator 32 may be attached to the capped quantum dot 28 but spaced from the particle 26 by the layer of capping material 30. A variety of different materials may be used for the activator including zinc and zinc compounds, zirconium compounds, gadolinium, tungsten compounds, aluminum, cadmium, lead, copper, and rare earth materials. As will be described below, when zinc is used as an activator, it has been found to provide a white light emission approximating diffuse sunlight when illuminated with ultraviolet light.

The result of the addition of the activator is a phosphor material 18 which may be dried and applied to the die 12 as described above.

Figure 5:
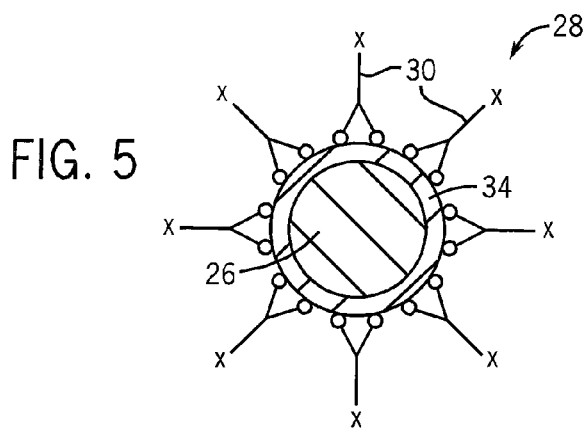
FIG. 5 is a schematic view of one embodiment of the phosphor material of the present invention.

Referring now to FIG. 5, in an alternative embodiment, the capping material 30 is applied over a transition layer 34 of a different semiconductor from the material of the particle 26. For example if the particle 26 is zinc sulfide, a capping layer might be zinc oxide.

Figure 6:
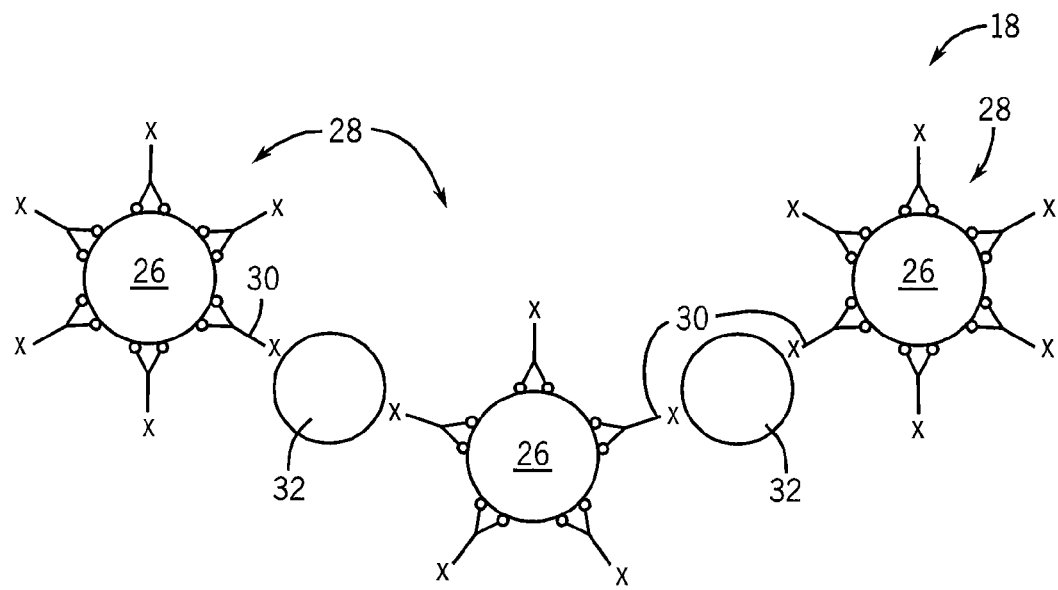
FIG. 6 is a schematic view of another embodiment of the phosphor material of the present invention.

Referring now to FIG. 6, while the inventor does not wish to be bound by a particular theory, it is believed that in some cases the phosphor material 18 may form an oligomer composed of chains of capped quantum dots 28 joined by a common activator 32 connected to the capping layers of two or more capped quantum dots 28.

Figure 7:
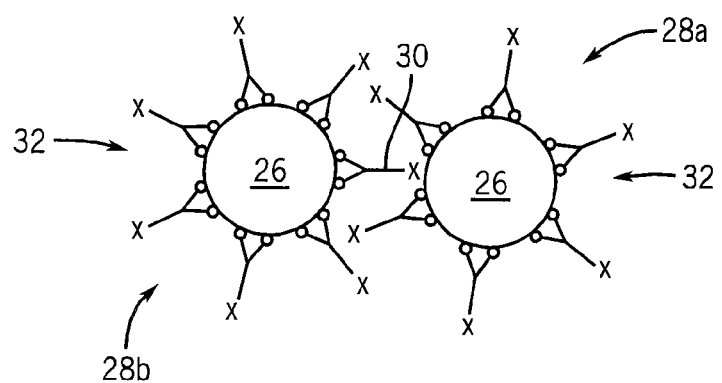
FIG. 7 is a schematic view of still another embodiment of the phosphor material of the present invention.

Referring to FIG. 7, in some cases, it is believed that the activator 32 for a particular capped quantum dot 28 may be provided by a second capped or uncapped quantum dot 28 that joins to the first quantum dot 28b by the capping material 30.

Particularly when the activator is zinc, the three step process of the synthesis of the quantum dots, their coating with the capping layer, and the attachment of the activator can be performed in a single reaction chamber simplifying the process.

In the following examples, the core refers to the particle 26, the shell to the capping material 30, and the phosphor to the combination of particle 26, capping material 30, and activator 32 as described above.

EXAMPLE I (I) Precursor A
ZnS/MSA (Core/Shell) Particles
A 1 L flask was charged with 24.0 g (80 mmol) $Zn(NO_3)_2 \cdot 6H_2O$, 300 mL of deionized water, and a large magnetic stir bar was added. The mixture was stirred to dissolve the zinc salt giving a slightly cloudy solution. To this was added, with stirring, 180 mL of concentrated aqueous ammonia. This immediately resulted in the formation of a suspension of an opaque white material, which subsequently dissolved after stirring for several minutes. The product was a clear colorless solution containing the $Zn(NH_3)_4^{2+}$ complex ion.

24 mL (77 mmol) of an aqueous $(NH_4)_2S$ solution was added in a dropwise fashion to the rapidly stirred $Zn(NH_3)_4^{2+}$ complex ion solution. This resulted in the formation of an opaque white suspension of nanoscale ZnS. The ZnS suspension was then treated with a solution of 2.0 g mercaptosuccinic acid (MSA, 13.4 mmol) dissolved in 100 mL of deionized water. The suspension was aged for one hour and then transferred to centrifuge bottles. The centrifuge bottles containing the ZnS/MSA suspension were then centrifuged at 4,000 rpm for 30 minutes. This resulted in the precipitation of a white paste containing ZnS/MSA nanoparticles, and a slightly cloudy supernatant. The supernatant was carefully decanted from the ZnS/MSA paste.

The ZnS/MSA product (paste) was purified by repeated cycles consisting of: (a) addition of fresh deionized water; (b) resuspension of the ZnS/MSA; (c) centrifugation of the suspension; and (d) careful decantation of the supernatant. After the final purification cycle, water was removed from the ZnS/MSA paste by freeze-drying. Yield: 6.5 g nanoscale ZnS/MSA particles, with average particle size typically between 3 and 15 nm.

(II) Phosphor from A
ZnS/MSA:Zn (Core/Shell:Activator) Phosphor
105 mg of the ZnS/MSA product was placed in a test tube. 10 mL of 0.01 M aqueous $ZnCl_2$ was added, the reagents were stirred for several minutes, and then allowed to age for 12 hours. The solid product was separated by centrifugation and careful decantation of the supernatant. The product was purified by repeated cycles consisting of: (a) addition of fresh water; (b) resuspension of the solids; (c) centrifugation of the suspension; and (d) careful decantation of the supernatant. After the final purification cycle, the last traces of water were removed from the solids by heating in an oven at 70° C. The product was a ZnS/MSA:Zn phosphor that emitted broad-spectrum yellowish-white light when irradiated at 365 nm.

EXAMPLE II (I) Precursor A
Precursor A was prepared as described above.
(II) Phosphor from A
ZnS/MSA:$ZrOCl_2$ (Core/Shell:Activator) Phosphor
100 mg of the ZnS/MSA product was placed in a test tube. 10 mL of 0.01 M aqueous $ZrOCl_2$ was added, the reagents were stirred for several minutes, and then allowed to age for 12 hours. The solid product was separated by centrifugation and careful decantation of the supernatant. The product was purified by repeated cycles consisting of: (a) addition of fresh water; (b) resuspension of the solids; (c) centrifugation of the suspension; and (d) careful decantation of the supernatant. After the final purification cycle, the last traces of water were removed from the solids by heating in an oven at 70° C. The product was a ZnS/MSA:ZrOCl$_2$ phosphor that emitted broad-spectrum yellowish light when irradiated at 365 nm.

EXAMPLE III (I) Precursor A

Precursor A was prepared as described above.

(II) Phosphor from A

ZnS/MSA:Gd (Core/Shell:Activator) Phosphor 105 mg of the ZnS/MSA product was placed in a test tube. 10 mL of 0.01 M aqueous Gd(NO$_3$)$_3$.6H$_2$O was added, the reagents were stirred for several minutes, and then allowed to age for 12 hours. The solid product was separated by centrifugation and careful decantation of the supernatant. The product was purified by repeated cycles consisting of: (a) addition of fresh water; (b) resuspension of the solids; (c) centrifugation of the suspension; and (d) careful decantation of the supernatant. After the final purification cycle, the last traces of water were removed from the solids by briefly heating in an oven at 100° C. The product was a ZnS/MSA:Gd phosphor that emitted yellowish-white broad-spectrum light when irradiated at 365 nm.

EXAMPLE IV (I) Precursor A

Precursor A was prepared as described above.

(II) Phosphor from A

ZnS/MSA:WO$_4$ (Core/Shell:Activator) Phosphor 105 mg of the ZnS/MSA product was placed in a test tube. 10 mL of 0.01 M aqueous Na$_2$WO$_4$.2H$_2$O was added, the reagents were stirred for several minutes, and then allowed to age for 12 hours. The solid product was separated by centrifugation and careful decantation of the supernatant. The product was purified by repeated cycles consisting of: (a) addition of fresh water; (b) resuspension of the solids; (c) centrifugation of the suspension; and (d) careful decantation of the supernatant. After the final purification cycle, the last traces of water were removed from the solids by briefly heating in an oven at 100° C. The product was a ZnS/MSA:WO$_4$ phosphor that emitted yellowish-white broad-spectrum light when irradiated at 365 nm.

EXAMPLE V (I) Precursor A

Precursor A was prepared as described above.

(II) Phosphor from A

ZnS/MSA:Al (Core/Shell:Activator) Phosphor 105 mg of the ZnS/MSA product was placed in a test tube. 10 mL of 0.01 M aqueous Al$_2$(SO$_4$)$_3$.18H$_2$O was added, the reagents were stirred for several minutes, and then allowed to age for 12 hours. The solid product was separated by centrifugation and careful decantation of the supernatant. The product was purified by repeated cycles consisting of: (a) addition of fresh water; (b) resuspension of the solids; (c) centrifugation of the suspension; and (d) careful decantation of the supernatant. After the final purification cycle, the last traces of water were removed from the solids by briefly heating in an oven at 100° C. The product was a ZnS/MSA:Al phosphor that emitted yellowish-white broad-spectrum light when irradiated at 365 nm.

EXAMPLE VI (I) Precursor A

Precursor A was prepared as described above.

(II) Phosphor from A

ZnS/MSA:Cd (Core/Shell:Activator) Phosphor 105 mg of the ZnS/MSA product was placed in a test tube. 10 mL of 0.01 M aqueous Cd(NO$_3$)$_2$.4H$_2$O was added, the reagents were stirred for several minutes, and then allowed to age for 12 hours. The solid product was separated by centrifugation and careful decantation of the supernatant. The product was purified by repeated cycles consisting of: (a) addition of fresh water; (b) resuspension of the solids; (c) centrifugation of the suspension; and (d) careful decantation of the supernatant. After the final purification cycle, the last traces of water were removed from the solids by briefly heating in an oven at 100° C. The product was a ZnS/MSA:Cd phosphor that emitted yellowish broad-spectrum light when irradiated at 365 nm.

EXAMPLE VII (I) Precursor A

Precursor A was prepared as described above.

(II) Phosphor from A

ZnS/MSA:Cd, NaCl (Core/Shell:Activators) Phosphor 105 mg of the ZnS/MSA product was placed in a test tube. 1 mL of 0.01 M aqueous Cd(NO$_3$)$_2$.4H$_2$O and 9 mL of 0.01 M aqueous NaCl were added. The reagents were stirred for several minutes, and then allowed to age for 12 hours. The solid product was separated by centrifugation and careful decantation of the supernatant. The product was purified by repeated cycles consisting of: (a) addition of fresh water; (b) resuspension of the solids; (c) centrifugation of the suspension; and (d) careful decantation of the supernatant. After the final purification cycle, the last traces of water were removed from the solids by briefly heating in an oven at 100° C. The product was a ZnS/MSA:Cd phosphor that emitted yellowish broad-spectrum light when irradiated at 365 nm.

EXAMPLE VIII (I) Precursor B.

ZnS/DTSA (Core/Shell) Particles

A 125 mL flask was charged with 3.0 g (10 mmol) Zn(NO$_3$)$_2$.6H$_2$O, 40 mL of deionized water, and a magnetic stir bar was added. The mixture was stirred to dissolve the zinc salt giving a slightly cloudy solution. To this was added, with stirring, 10 mL of concentrated aqueous ammonia. This immediately resulted in the formation of a suspension of an opaque white material, which subsequently dissolved after stirring for several minutes. The product was a clear colorless solution containing the Zn(NH$_3$)$_4^{2+}$ complex ion.

3 mL (9.6 mmol) of an aqueous (NH$_4$)$_2$S solution was added in a dropwise fashion to the rapidly stirred Zn(NH$_3$)$_4^{2+}$ complex ion solution. This resulted in the formation of an opaque white suspension of nanoscale ZnS. The ZnS suspension was then treated with a solution comprising 0.25 g of the sodium salt of dithiosquaric acid (DTSA, 1.31 mmol) dissolved in 10 mL of deionized water. The suspension was stirred for five minutes and then transferred to centrifuge bottles. The centrifuge bottles containing the ZnS/DTSA suspension were then centrifuged at 4,000 rpm for 60 minutes. This resulted in the precipitation of an off-white paste containing ZnS/DTSA nanoparticles, and a slightly cloudy supernatant. The supernatant was carefully decanted from the ZnS/MSA paste.

The ZnS/DTSA product was purified by repeated cycles consisting of: (a) addition of fresh deionized water; (b) resuspension of the ZnS/DTSA; (c) centrifugation of the suspension; and (d) careful decantation of the supernatant. After the final purification cycle, water was removed from the ZnS/DTSA paste by freeze-drying. Yield: 1.0 g nanoscale ZnS/DTSA particles, with average particle size typically between 3 and 10 nm.

II. Phosphor from B

ZnS/DTSA:Al, Cu (Core/Shell:Activators) Phosphor 50 mg of the ZnS/DTSA product, 10 mL deionized water, and a small magnetic stir bar were placed in a 15 mL vial. 50 µL of 0.01 M aqueous $CuCl_2.H_2O$ and 50 µL of 0.10 M aqueous $Al_2(SO_4)_3.18H_2O$ was added, the reagents were stirred for several minutes, and then allowed to age for 12 hours. The solid product was separated by centrifugation and careful decantation of the supernatant. The product was purified by cycles consisting of: (a) addition of fresh water; (b) resuspension of the solids; (c) centrifugation of the suspension; and (d) careful decantation of the supernatant. The product was a ZnS/DTSA:Al,Cu phosphor that emitted broad-spectrum white light when irradiated at 365 nm.

EXAMPLE IX (ONE-STEP PROCESS)

ZnE/MSA:Zn (E=S,O)

Figure 4:
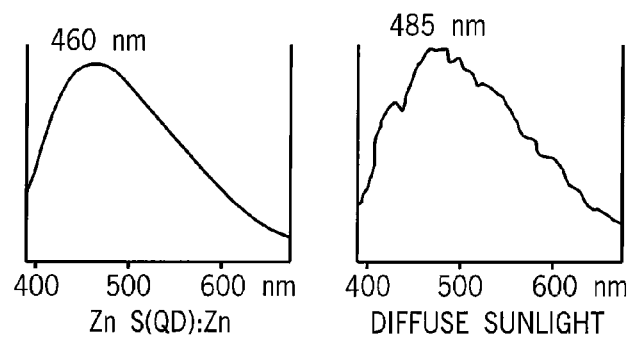
FIG. 4 illustrates graphs of the spectrum of light emitted by the phosphor material of the present invention when irradiated compared with a spectrum for diffuse sunlight.

A 250 mL beaker was charged with 3.0 g mercaptosuccinic acid (MSA, 20 mmol), 100 mL of deionized water, and a magnetic stir bar. After dissolving the MSA, 2.5 g of solid basic zinc carbonate ($Zn_5(CO_3)_2(OH)_6$, 4.6 mmol) was slowly added to the stirred solution. The mixture was stirred at room temperature for several minutes in order to dissolve the basic zinc carbonate. The solution was placed on a hot plate/stirrer and heated to near boiling with stirring. Several sticky yellowish-white blobs formed as the temperature of the solution neared boiling. The temperature of the mixture was maintained near boiling (ca. 90° C.) until about half of the liquid evaporated. The sticky yellowish-white blobs were removed from the mixture and then allowed to dry and harden at room temperature in a desiccator. The dry product was ground in a mortar and pestle to produce 1.8 g of a dry off-white powder. The product emitted broad-band white light when irradiated at 365 nm. A spectrum of the light emitted is shown in FIG. 4.

While the inventor does not wish to be bound by a particular theory it is believed that the precursor core material is one or both of zinc oxide and zinc sulfide in nano particle form where the sulfur is obtained from the mercaptosuccinic acid. X-ray diffraction studies of this material suggest that it is either an amorphous material such as an oligomer or extremely small discrete nanoscale particulates.

As used herein phosphorescent shall mean a material providing persistent emission of light following exposure to and removal of incident radiation or electricity. Thus, while in the preferred embodiment the phosphor material 18 is stimulated by the ultraviolet light emission 14, it may also be possible to simulate this material using electrical current.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

I claim:

1. A solid-state lamp comprising:
   a light emitting diode providing an ultraviolet light output;
   a quantum dot phosphor receiving the ultraviolet light to emit a white light, the quantum dot phosphor comprising:
   (a) a quantum dot;
   (b) a capping layer surrounding the quantum dot; and
   (c) an activator material attached to the capping layer to be spaced from the quantum dot by the capping layer so as to promote phosphorescence with the quantum dot.

2. The solid-state lamp of claim 1 wherein the quantum dot is a zinc compound.

3. The solid-state lamp of claim 1 wherein the quantum dot is zinc sulfide.

4. The solid-state lamp of claim 1 further including a transition layer between the quantum dot and the capping layer providing a quantum well structure.

5. The solid-state lamp of claim 4 wherein the transition layer is zinc oxide.

6. The solid-state lamp of claim 1 wherein the activator includes zinc.

7. The solid-state lamp of claim 1 wherein the quantum dot has a diameter ranging from 2 to 10 nm.

8. The solid-state lamp of claim 1 wherein broad-band white light is emitted having substantial intensity over a wavelength range of 425 and 650 nm and having a maximum intensity between 475-525 nm.

9. The solid-state lamp of claim 1 wherein the capping layer is carboxyl or thiolate group.

10. The solid-state lamp of claim 9 wherein the capping layer is selected from the group consisting of: mercaptosuccinic acid and dithiosquaric acid.

11. The solid-state lamp of claim 1 wherein the quantum dot phosphor is an oligomer of quantum dots having capping layers and joined at common activators.

12. The solid-state lamp of claim 1 wherein the activator is another quantum dot.

13. The solid-state lamp of claim 1 wherein the quantum dot phosphor includes different activators associated with different quantum dots.

14. A stimulatable light emitting material comprising a plurality of:
   (a) quantum dots;
   (b) capping layers surrounding each quantum dot; and
   (c) activator materials attached to the capping layer to be spaced from the quantum dot by the capping layers so as to promote phosphoresce with the quantum dot.

15. A method of manufacturing a phosphorescent material comprising the steps of:
   (a) preparing a nano particulate material of nanoscale particles;
   (b) applying a capping layer to the particles; and
   (c) attaching an activator material to the capping layer as attached to the particles to be spaced from the particles by the capping layer to promote phosphorescence.

16. The method of claim 15 wherein the step of preparing the nano particulate material combines a zinc salt with a sulfur source to provide a suspension of nanoscale zinc sulfide.

17. The method of claim 15 wherein the capping layer is carboxyl or thiolate group.

18. The method of claim 15 wherein the capping layer is selected from the group consisting of: mercaptosuccinic acid and dithiosquaric acid.

19. The method of claim 15 wherein the particles of the nano particulate material are grown by an arrested precipitation process.

20. The method of claim 15 further including the step of creating a transition layer of material different from the material of the particles between the particles and the capping layer providing a quantum well structure.

21. The method of claim 15 further including the step of stimulating the phosphorescent material with ultraviolet light.

* * * * *